United States Patent [19]

Mimura

[11] Patent Number: 4,469,529
[45] Date of Patent: Sep. 4, 1984

[54] METHOD FOR HEATING SEMICONDUCTOR WAFER BY MEANS OF APPLICATION OF RADIATED LIGHT WITH SUPPLEMENTAL CIRCUMFERENTIAL HEATING

[75] Inventor: Yoshiki Mimura, Kanagawa, Japan

[73] Assignee: Ushio Denki Kabushiki Kaisha, Tokyo, Japan

[21] Appl. No.: 445,493

[22] Filed: Nov. 30, 1982

[30] Foreign Application Priority Data

Dec. 4, 1981 [JP] Japan ................................ 56-194575
Jun. 30, 1982 [JP] Japan ................................ 57-111499

[51] Int. Cl.³ .................... H01L 21/265; H01L 21/26
[52] U.S. Cl. .................................... 148/1.5; 29/576 T; 29/576 B; 148/175; 219/85 BA; 219/85 BM; 219/354; 427/55
[58] Field of Search ............... 148/1.5, 175; 29/576 T, 29/576 B; 219/85 BA, 85 BM, 405, 354; 427/55

[56] References Cited

U.S. PATENT DOCUMENTS

| | | | |
|---|---|---|---|
| 4,081,313 | 3/1978 | McNeilly et al. | 427/55 |
| 4,113,547 | 9/1978 | Katz et al. | 148/175 |
| 4,331,485 | 5/1982 | Gat | 148/1.5 |
| 4,350,537 | 9/1982 | Young et al. | 148/1.5 |

FOREIGN PATENT DOCUMENTS

| | | | |
|---|---|---|---|
| 64937 | 4/1982 | Japan | 29/576 T |
| 64936 | 4/1982 | Japan | 29/576 T |

OTHER PUBLICATIONS

Lietoila et al., J. Appl. Phys. 53(2) [1982], p. 1169

*Primary Examiner*—Upendra Roy
*Attorney, Agent, or Firm*—Ziems, Walter & Shannon

[57] ABSTRACT

When heating a semiconductor wafer by means of application of radiated light, subsidiary heating means which elongates along the circumference of the wafer is employed to additionally heat or to preheat the circumferential portion of the wafer so as to make the temperature of the wafer uniform at the entire surface thereof. Use of such subsidiary heating means is effective to prevent the occurrence of such a damage as slip line or the like in the wafer.

14 Claims, 4 Drawing Figures

METHOD FOR HEATING SEMICONDUCTOR WAFER BY MEANS OF APPLICATION OF RADIATED LIGHT WITH SUPPLEMENTAL CIRCUMFERENTIAL HEATING

BACKGROUND OF THE INVENTION

1. Field of the Invention:

This invention relates to a method for heating a semiconductor wafer by means of application of radiated light.

2. Description of the Prior Art:

The ion implantation process has recently been finding actual utility as an effective method for introducing dopant atoms into a semiconductor wafer since it is possible to control accurately the concentration levels of dopant atoms and the depths of resulting junctions. In the ion implantation process, the dopant atoms are ionized and accelerated to high velocity and the wafer is bombarded with the dopant atoms. Whenever the ion implantation process is carried out, it is necessary to subject each resulting wafer to a subsequent heating treatment to about 1000° C. or higher in an inert gas such as argon so that the wafer is annealed to heal crystal defects which have been developed due to the implantation of ions. This heat treatment must be carried out in a short time period so as to prevent the concentration distribution of the implanted dopant atoms in the depthwise direction of the wafer from changing due to thermal diffusion. Furthermore, there is an outstanding demand for the establishment of a highspeed heating and cooling cycle for wafers in order to improve the productivity.

Reflecting the above-mentioned demands, a novel method has recently been developed to heat wafers by means of application of radiated light. According to this method, the temperatures of wafers may be raised to 1000° C.–1400° C. in a time period as short as a few seconds.

It has however been found that, when a wafer, for example, a wafer of single crystal of silicon is heated to 1000° C. or higher in a few seconds, a damage called "slip line" or bending is developed in the wafer because of a difference in the rising velocity of temperature between its circumferential portion and its central portion, in other words, due to a non-uniform temperature rise therebetween. The thickness of a wafer is generally very small, namely, of a level of about 0.5 mm or so and its thicknesswise temperature distribution is thus rendered substantially uniform in a very short time period of a level of $10^{-3}$ second or so. Accordingly, such a damage as slip line may be possibly avoided if the temperature distribution on the surface of each wafer is rendered uniform. However, it is very difficult to prevent the development of such a damage as slip line in actual process even if the surface of each wafer is exposed to radiated light having a uniform irradiation energy density, because more heat is to radiate off from the circumferential portion of the wafer than its central portion and the circumferential portion becomes cooler than the central portion.

SUMMARY OF THE INVENTION

With the foregoing in view, the present invention has as its object the provision of a heating method of a semiconductor wafer by means of application of radiated light without developing such a damage as slip line or the like.

In one aspect of this invention, there is thus provided a method for heating a semiconductor wafer by means of application of light radiated from a light source, which method comprises arranging subsidiary heating means in such a way that the subsidiary heating means elongates along the circumference of the semiconductor wafer; and the heating the semiconductor wafer by means of application of light radiated from the light source either while additionally or assistantly heating the semiconductor wafer at its circumferential portion by the subsidiary heating means or after preheating the semiconductor wafer at its circumferential portion by the subsidiary heating means.

The heating method of this invention is effective in improving the uniformity of the temperature distribution of a wafer surface, thereby successfully preventing the occurrence of such a damage as slip line or the like. Therefore, the present invention has brought about an extremely large value from the practical viewpoint.

The above and other objects, features and advantages of the present invention will become apparent from the following description and the appended claims, taken in conjunction with the accompanying drawings.

DETAILED DESCRIPTION OF THE INVENTION

Figure 1:
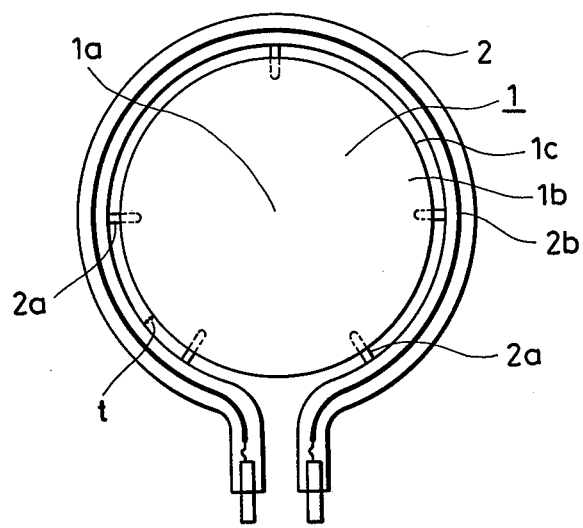
FIG. 1 is a top plan view of a wafer and subsidiary heating means placed in a light-irradiating furnace.

Referring now to the drawings, preferred embodiments of this invention will be described.

Figure 2:
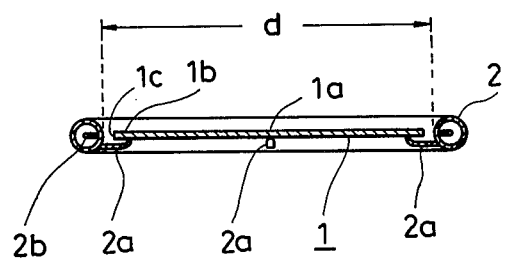
FIG. 2 is a cross-sectional front view of the wafer and subsidiary heating means.

Reference is first made to FIG. 1 and FIG. 2. Although not shown in the drawings, twelve (12) tubular halogen lamps, each of the power consumption of 1.5 KW, are arranged close to one another in a plane over and parallel to the upper surface of the semiconductor wafer 1 to be heat-treated thereby forming a plane light source, and another plane light source of the same arrangement of the lamps also provided underneath and parallel to the lower surface of the wafer 1 so that the wafer can be heated at both upper and lower surfaces thereof to about 1250° C. at central portions 1a of the upper and lower surfaces. The above plane light sources consume in total about 35 KW of electric power for the radiation of light. The wafer is one made of single crystal of silicon of 4 inches in diameter, which has been doped with boron in accordance with the ion implantation process.

Numeral 2 indicates a halogen or infrared lamp which has a circular sealed tube made of silica glass. The lamp 2 is provided with a filament 2b along the axis of the tube and arranged surrounding the periphery 1c of the wafer 1. The lamp 2 is equipped at several locations with quartz-made hooks 2a which support the wafer 1 thereon. Since the inner diameter d of the circular tube of the lamp 2 is about 11 cm or so, the clearance t between the wafer 1 and the lamp 2 is approximately 4 mm or so. When the lamp 2 is kept on with the power consumption of about 920 W so as to additionally heat the circumferential portion 1b of the wafer 1 upon heating the v ifer by means of application of light radiated from the plane light sources, the surface temperature of the central portion 1a is raised to 1250° C. while the circumferential portion 1b is heated to 1255° C. or so. Although the surface temperature becomes somewhat higher at the circumferential portion 1b, the wafer can be heat-treated without developing any damage such as slip line or bending. On the contrary, the temperature at the circumferential portion 1b will not exceed about 1120° C. and the development of slip lines will be observed if the heating should be effected solely by the light radiated from the plane light sources without additional heating by the subsidiary heating means.

As has been understood from the above example, the object of this invention is to avoid the occurrence of such a damage as slip line or the like by additionally heating the circumferential portion 1b of the wafer 1 with the subsidiary heating means 2 provided along the circumferential portion 1b so as to compensate a temperature drop at the circumferential portion 1b due to radiation of heat therefrom and thus minimizing the temperature difference between the central portion and the circumferential portion and making the temperature of the wafer uniform at the entire surface thereof.

The lamp 2 may be lit previous to the application of the light radiated from the plane light sources, so as to preheat the circumferential portion 1b of the wafer 1. Such preheating by the subsidiary heating means may also contribute to compensate a temperature drop at the circumferential portion 1b thereby avoiding the occurrence of such a damage as slip line or the like in the wafer 1.

Incidentally, the heating of wafers by means of radiated light is generally carried out in an atmosphere of an inert gas such as argon or in a vacuum.

Figure 3:
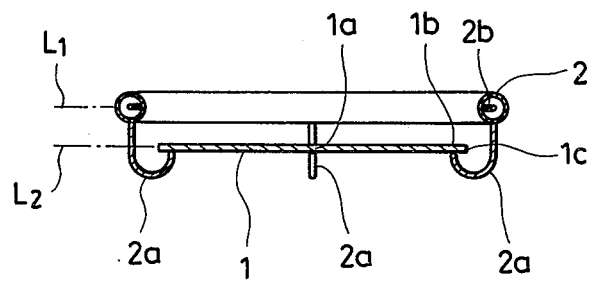
FIG. 3 is a cross-sectional front view of the another arrangement of the wafer and subsidiary heating means.

FIG. 3 shows another example of arrangement of wafer and subsidiary heating means. In this example, the circular lamp 2 is arranged in a level $L_1$ slightly higher than the level $L_2$ in which the wafer 1 is positioned, and the circumferential portion 1b of the wafer 1 is heated by receiving heat from the lamp 2 at its upper surface. Thus, the subsidiary heating means may be arranged in a different level from the wafer, while it is necessary to elongate along the circumference of the wafer in the neighborhood thereof.

Figure 4:
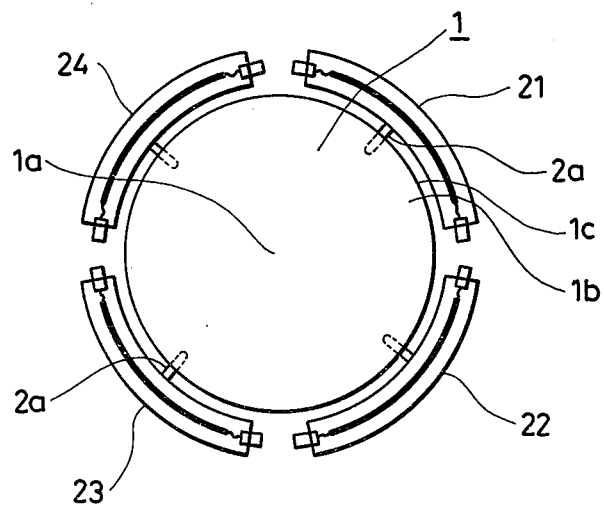
FIG. 4 shows another example of the subsidiary heating means.

In practice of the heating method according to this invention, any heating means which generates or radiates heat may be applicable as the subsidiary heating means. For example, the subsidiary heating means may comprise a plurality of thermic ray radiating lamps, for instance, as shown in FIG. 4, four arcuate halogen lamps 21, 22, 23 and 24 which are arranged in a circular line along the circumference of the wafer 1. A resistive heating element or elements made of a high fusing point metal such as molybdenum or the like arranged in a circular line along the circumference of the wafer may be used as the subsidiary heating means.

Having now fully described the invention, it will be apparent to one of ordinary skill in the art that many changes and modifications can be made thereto without departing from the spirit or scope of the invention as set forth herein.

What is claimed is:

1. A method for heating a semiconductor wafer by means of application of light radiated from a light source, which method comprises the steps of arranging subsidiary electrical heating means adjacent to and extending along the circumference of the semiconductor wafer; and heating the semiconductor wafer by means of application of light radiated from the light source to the semiconductor wafer, including application of the light to the circumferential portion of the semiconductor wafer, while additionally heating the semiconductor wafer at its circumferential portion by the subsidiary heating means to thereby provide a uniform temperature across the surface of the wafer.

2. A method as claimed in claim 1, wherein the subsidiary heating means comprises at least one thermic ray radiating lamp.

3. A method as claimed in claim 1, wherein the subsidiary heating means comprises at least one resistive heating element fabricated from a high fusing point metal.

4. A method as claimed in claim 1, wherein the light source comprises at least one plane light source, the plane light source comprising a plurality of tubular halogen lamps arranged adjacent to one another in a plane parallel to the surface of the semiconductor wafer.

5. A method as claimed in claim 1, wherein the semiconductor wafer has been pretreated by the ion implantation process.

6. A method as claimed in claim 3, wherein the resistive heating element is fabricated from molybdenum.

7. A method as claimed in claim 2, wherein the subsidiary heating means has hooks which support the semiconductor wafer thereon.

8. A method for heating a semiconductor wafer by means of application of light radiated from a light source, which method comprises the steps of arranging subsidiary electrical heating means adjacent to and extending along the circumference of the semiconductor wafer; and heating the semiconductor wafer by means of application of light radiated from the light source to the semiconductor wafer, including application of the light to the circumferential portion of the semiconductor wafer, after preheating the semiconductor wafer at its circumferential portion by the subsidiary heating means to thereby provide a uniform temperature across the surface of the wafer.

9. A method as claimed in claim 8, wherein the subsidiary heating means comprises at least one thermic ray radiating lamp.

10. A method as claimed in claim 8, wherein the subsidiary heating means comprises at least one resistive heating element fabricated from a high fusing point metal.

11. A method as claimed in claim 8, wherein the light source comprises at least one plane light source, the plane light source comprising a plurality of tubular halogen lamps arranged adjacent to one another in a plane parallel to the surface of the semiconductor wafer.

12. A method as claimed in claim 8, wherein the semiconductor wafer has been pretreated by the ion implantation process.

13. A method as claimed in claim 9, wherein the subsidiary heating means has hooks which support the semiconductor wafer thereon.

14. A method as claimed in claim 10, wherein the resistive heating element is fabricated from molybdehum.

* * * * *